United States Patent
Bouvier

(10) Patent No.: US 6,636,125 B2
(45) Date of Patent: Oct. 21, 2003

(54) MODULATION DEVICE OF THE PULSE WIDTH OF VERY HIGH-FREQUENCY SIGNALS

(75) Inventor: Stephane Bouvier, Cairon (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 121 days.

(21) Appl. No.: 09/988,848

(22) Filed: Nov. 19, 2001

(65) Prior Publication Data

US 2002/0084864 A1 Jul. 4, 2002

(30) Foreign Application Priority Data

Nov. 21, 2000 (FR) .............................. 00 15014

(51) Int. Cl.⁷ ................................................ H03K 7/08
(52) U.S. Cl. ........................................ 332/110; 332/109
(58) Field of Search ........................ 332/106, 109–111; 327/172–175

(56) References Cited

U.S. PATENT DOCUMENTS 5,619,538 A * 4/1997 Sempel et al. ............... 375/328

FOREIGN PATENT DOCUMENTS

| DE | 19855022 A | 5/2000 |
| EP | 0726668 A1 | 8/1996 |
| EP | 0913977 A2 | 5/1999 |
| GB | 2348337 A | 9/2000 |
| JP | 01202916 A | 8/1989 |

OTHER PUBLICATIONS

"Zero Crossing Detector"; IBM Technical Disclosure Bulletin; Oct. 1972; pp. 1432–1433.*

* cited by examiner

Primary Examiner—David C. Mis
(74) Attorney, Agent, or Firm—Steven R. Biren

(57) ABSTRACT

The present invention relates to a modulation device MD, which is designed to produce an output signal Vout comprising a succession of pulses.

According to the invention, a device of this type includes:
- two transistors T1 and T2, which are arranged as a differential pair;
- a capacitive element C, which is connected between the two transistors T1 and T2;
- adjusting means LC1, LC2, UC1, UC2, in order to adjust the potential of at least one of the terminals of the capacitive element C; and
- comparing means CMP, which supply the output signal Vout, which is representative of the sign of the voltage Vc, which is present at the terminals of the capacitive element C.

By means of a simple and substantially analog structure, the invention permits rapid, flexible control of the width of the pulses of the output signal Vout.

6 Claims, 3 Drawing Sheets

MODULATION DEVICE OF THE PULSE WIDTH OF VERY HIGH-FREQUENCY SIGNALS

The present invention relates to a modulation device, which is designed to receive an input signal comprising a succession of pulses with a predetermined width, and to produce an output signal comprising a succession of pulses with an adjustable width.

A device of this type is known from Japanese patent application published under number JP 01202916. The modulation device which is described in this application is designed to receive an input signal with an asymmetrical nature, and is provided with a first and a second branch, which make it possible to decrease or increase respectively the width of the pulses of the output signal of the device. For this purpose, the said branches comprise an assortment of delay cells and logic gates, a selection of which of the branches must be activated being made possible by means of a multiplexer.

The known modulation device has a complex structure, which has a certain number of disadvantages.

Firstly, it is inevitable that each of the logic gates included in this device induces a delay in the signals which pass through them. Although delays of this type can be ignored or disregarded in applications in which the signals to be processed have a frequency which is low or not very high, for example of approximately a KiloHertz or MegaHertz, these delays, which are typically approximately a nanosecond, or a tenth of a nanosecond in the present state of the art, will have a detrimental effect on processing of signals which have a very high frequency, for example of approximately a GigaHertz.

Moreover, the delay cells which are used in the known device must be perfectly paired to enable deliberate absence of modulation of the pulse width of the output signal, in which situation the two branches must introduce alternately the same phase shift in the output signal. Pairing of this type is very difficult, and therefore very costly, to implement in practice.

In addition, it is often preferable, particularly when the frequency of the signals to be processed is very high, to use differential structures which have better rates of rejection in common mode, and factors of immunity to noise which are higher than those of the asymmetrical structures such as that of the known device. For this purpose, the above described structure must be duplicated, which will increase further still the complexity of the known device, when configured in differential mode, and, consequently, its production cost, while making a modulation device of this type even more sensitive to the aforementioned disadvantages.

The object of the invention is to eliminate these disadvantages, by proposing a modulation device which has a simple structure, without logic gates and delay cells, and which permits processing of very high-frequency differential signals.

In fact, according to the invention, a modulation device according to the introductory paragraph includes:
  a first and a second transistor, which are fitted as a differential pair, the conduction of which is controlled by means of the input signal of the device;
  a capacitive element, which is provided with a first and a second terminal, which are connected respectively between the first and second transistor;
  adjusting means for adjusting a potential of at least one of the said terminals; and
  comparing means which are designed to supply the output signal of the device, an instantaneous value of which is representative of the sign of a voltage, which is taken from the terminals of the capacitive element.

In the device according to the invention, quasi-simultaneous transitions which delimit the pulses of the input signal generate gradients in curves which are representative of the development of the potentials of the terminals of the capacitive element, owing to the progressive charges and discharges of the latter. Each intersection of said potential curves corresponds to a transition of the output signal of the modulation device. By giving rise to offsetting of the potential of at least one of the terminals of the capacitive element, the adjusting means make it possible to offset over a period of time the instants at which intersections of this type occur, and thus to adjust the width of the pulses of the output signal of the device. The processing of the input signal is thus substantially analog in the device according to the invention, which provides it with great speed, and makes it particularly suitable for "very high-frequency" applications.

In addition, the device according to the invention has a very simple, and substantially symmetrical structure, which allows it to process differential signals, and provides it with a high rate of rejection in common mode, and with a factor of immunity to high levels of noise.

In a particular embodiment of the invention, the adjusting means include means for decreasing, and means for increasing potential, which are associated with at least one of the terminals of the capacitive element.

This embodiment makes it possible to control simply and flexibly the intersections of the potential curves, and thus the width of the pulses of the output signals of the modulation device according to the invention.

According to a particularly advantageous embodiment of the invention, means for decreasing and means for increasing potential will be associated with each of the terminals of the capacitive element, which will permit greater flexibility and better resolution of the adjustment of the width of the pulses of the modulation device according to the invention.

As previously stated, the modulation device according to the invention is particularly well suited for processing signals which have a very high frequency. It will thus advantageously be used for controlling very high-rate data emitters, such as emitters of light signals in optical telecommunications systems, which have throughputs which are measured in Gigabits/second. The invention thus relates to a light signal emitter, which includes a source which is designed to emit radiation when a control signal for said source has an active state, the emitter additionally including a modulation device as previously described, for adjusting the duration of the active states of the control signal.

In one of its most advantageous applications, the invention also relates to a telecommunications system including:
  an emitter for light signals, as previously described;
  a receiver for light signals; and
  a propagation medium, which permits transit of said signals from the emitter to the receiver.

These and other aspects of the invention will be apparent from and elucidated with reference to the embodiment(s) described hereinafter In the drawings.

Figure 1:
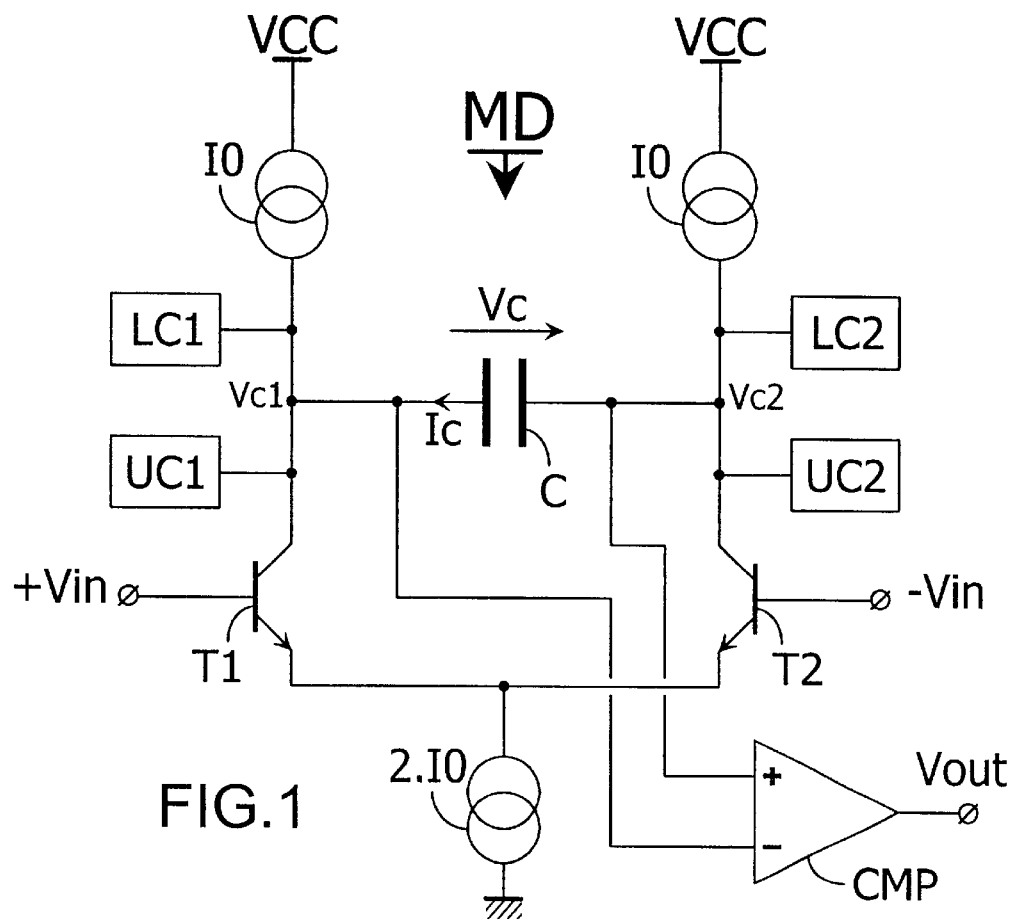
FIG. 1 is a functional diagram describing a modulation device according to the invention.

FIG. 1 represents schematically a modulation device MD according to the invention. This device MD is designed to receive an input signal Vin, in the form of a succession of pulses with a predetermined width, and to emit an output signal Vout, in the form of a succession of pulses with an adjustable width. The device MD includes a first and a second transistor T1 and T2, which are arranged as a differential pair, the conduction of which is driven by means of the input signal Vin.

In this example, the transistors T1 and T2 are bipolar transistors, the bases, collectors and emitters of which form respectively terminals for polarization, transfer and reference. In other embodiments, it will be possible to use transistors of the MOS type, the gates, drains and sources of which will form respectively said terminals for polarization, transfer and reference.

Each transfer terminal for the first and the second transistors T1 and T2 is connected to a current source, which is designed to deliver a current I0. The differential pair is polarized by means of a current source, which is connected to the reference terminals of the first and second transistors T1 and T2, and is designed to deliver a current with a value 2.I0.

The modulation device MD according to the invention additionally includes a capacitive element C, which is provided with a first and a second terminal, which are connected respectively to the transfer terminals of the first and the second transistor T1 and T2.

In this embodiment of the invention, the modulation device MD includes adjusting means for adjusting the potentials Vc1 and Vc2 of the first and second terminals of the capacitive element C. These adjusting means include means LC1 and LC2 for decreasing potential, and means UC1 and UC2 for increasing potential, which are associated respectively with the first and second terminals of the capacitive element C.

Finally, the modulation device MD includes means for comparison CMP, which are designed to supply the output signal Vout, an instantaneous value of which is representative of the sign of a voltage Vc, taken from the terminals of the capacitive element C.

In this modulation device, the first transistor T1 is conductive when the input signal Vin is positive, and otherwise it is blocked. The second transistor T2 is conductive when the input signal Vin is negative, and otherwise it is blocked.

When a rising edge of the input signal Vin occurs, a current Ic passes through the capacitive element C, in the direction shown in the figure, which gives rise to a progressive decrease in the potential Vc1 of the first terminal of the capacitive element C, and a progressive increase in the potential Vc2 of the second terminal of the said capacitive element C.

When a falling edge of the input signal Vin occurs, a current Ic passes through the capacitive element C, in the direction opposite that represented in the figure, which gives rise to a progressive decrease in the potential Vc2 of the second terminal of the capacitive element C, and a progressive increase in the potential Vc1 of the first terminal of said capacitive element C. Thus, quasi-simultaneous transitions which indicate the pulses of the input signal Vin generate gradients in curves which are representative of the development of the potentials Vc1 and Vc2 of the first and second terminals of the capacitive element C, owing to the progressive charges and discharges of the latter. Each time said potential curves intersect, and thus each time there is a cancellation followed by a change of sign of the voltage Vc taken from the terminals of the said capacitive element C, there is a corresponding transition of the output signal Vout of the modulation device. By giving rise to offsetting of the potentials of the terminals of the capacitive element, the adjusting means make it possible to offset over a period of time the instants at which intersections of this type occur, and thus to adjust the width of the pulses of the output signal Vout of the modulation device MD.

Figure 2:
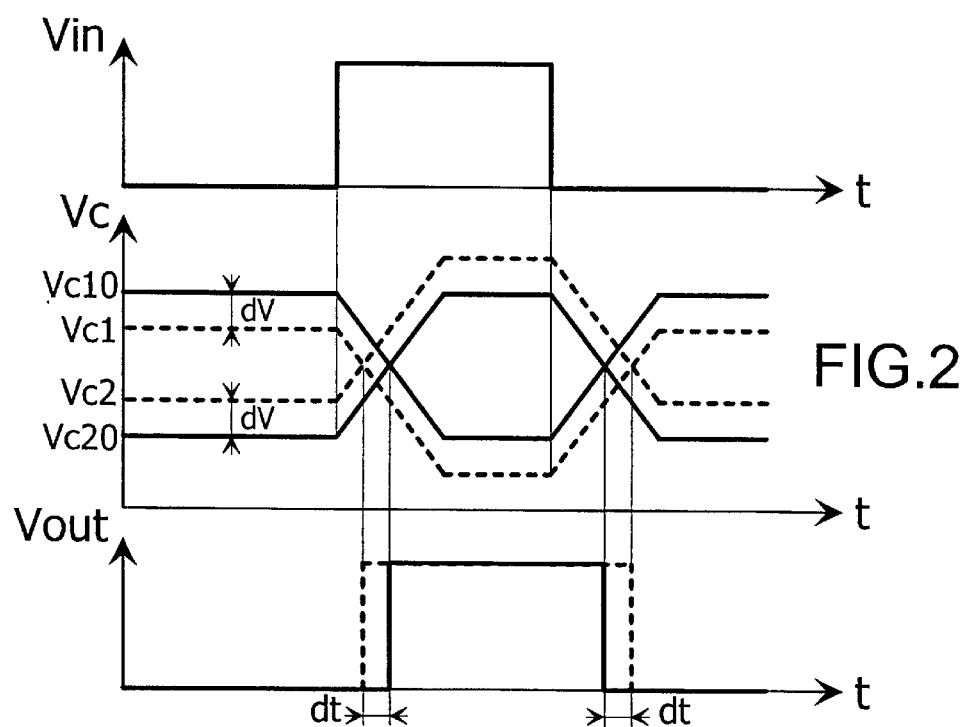
FIG. 2 is a series of timing diagrams which illustrate developments of potentials which are possible in a device of this type.

FIG. 2 is a series of timing diagrams, which represent the development of various electrical values which are present in the above-described modulation device, in order to permit better understanding of the functioning of this device.

The curves Vc10 and Vc20 represent in solid lines the development of the potentials of the first and second terminals of the capacitive element C, when the adjusting means are inactive.

As previously explained, after the signal Vin has presented a rising edge, which means the start of a pulse, the potential Vc10 of the first terminal of the capacitive element decreases progressively, whereas the potential Vc20 of the second terminal of the capacitive element decreases progressively. In this case, the decreases and increases in potential have been represented in a linear form, in order to facilitate understanding of the figure as a whole. In reality, these decreases and increases have, respectively, increasing logarithmic and decreasing exponential forms.

In this example, the comparison means are wired such that, for as long as the voltage Vc taken from the terminals of the capacitive element is negative, the output signal Vout which they emit has a logic "0" level, said output signal Vout otherwise having a logic "1" level. Thus, when the difference in potential Vc20-Vc10 becomes positive, the output signal Vout changes from the logic "0" level to the logic "1" level, which indicates the start of a pulse.

Conversely, after the signal Vin has presented a falling edge, signifying the end of a pulse, the potential Vc10 of the first terminal of the capacitive element will increase progressively, whereas the potential Vc20 of the second terminal of the capacitive element will decrease progressively. When the difference in potential Vc20-Vc10 becomes negative once more, the output signal Vout will change from the logic "1" level to the logic "0" level, which will indicate the end of a pulse.

FIG. 2 represents in broken lines the development of the potentials Vc1 and Vc2 of the first and second terminals of the capacitive element, when the means for decreasing the potential LC1 and the means for increasing the potential UC2, which are associated respectively with said terminals, are active. The potential curves which are associated with said terminal are thus similar to those previously described, apart from the fact that the potential Vc1 has an offset of −dV relative to the potential Vc10, whereas the potential Vc2 has an offset of +dV relative to the potential Vc20. An adjustment of this type has the effect of advancing by a duration dt the instant at which the difference in potential Vc2−Vc1 becomes positive, and thus the instant at which the output signal Vout has a rising edge, signifying the start of a pulse.

Conversely, the instant at which the difference in potential Vc2−Vc1 becomes negative, and thus the instant at which the output signal Vout has a falling edge, signifying the start of a pulse, is delayed by a duration dt.

Activation of the adjusting means in the above-described conditions thus permits an increase with a duration of 2.dt in the width of the pulses of the output signal Vout. It can also be considered to activate only the means LC1 for decrease, or the means UC2 for increase, which will make it possible to increase the width of the pulses by a duration dt.

Figure 3:
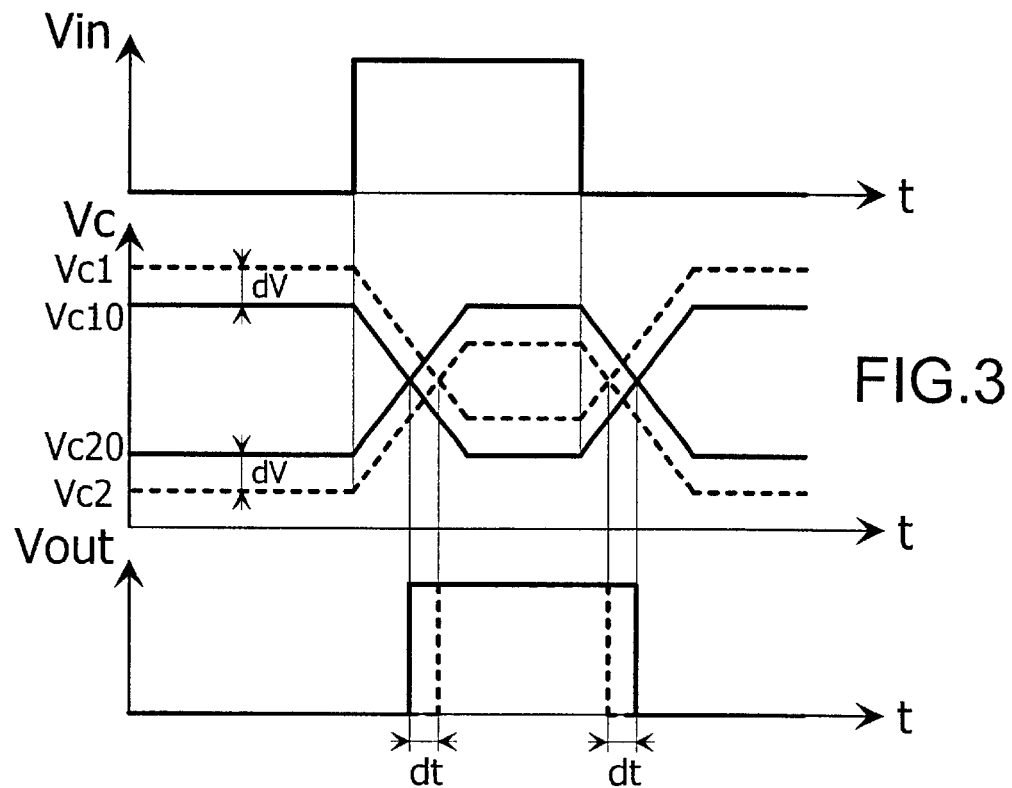
FIG. 3 is a series of timing diagrams which illustrate other developments of potentials which are possible in a device of this type.

FIG. 3 is another series of timing diagrams, which represent the development of the same electrical values as previously, in the case of a different configuration of the adjusting means. The elements of this figure which are common to the preceding figure have been provided with the same references, and will not be described again now.

FIG. 3 represents in broken lines the development of the potentials Vc1 and Vc2 of the first and second terminals of the capacitive element, when the means UC1 for increasing the potential and the means LC2 for decreasing the potential, which are associated respectively with the said terminals, are active.

The potential curves which are associated with said terminals are thus similar to those which describe the development of the potentials Vc10 and Vc20, apart from the fact that the potential Vc1 has offsetting of +dV relative to the potential Vc10, whereas the potential Vc2 has offsetting of −dV relative to the potential Vc20. Adjustment of this type has the effect of advancing by a duration dt the instant at which the difference in potential Vc2−Vc1 becomes positive, and thus the instant at which the output signal Vout has a rising edge, signifying the start of a pulse.

Conversely, the instant at which the difference in potential Vc2−Vc1 becomes negative, and thus the instant at which the output signal Vout has a falling edge, indicating the start of a pulse, is advanced by a duration dt.

Activation of the adjusting means in the above-described conditions thus permits a decrease with a duration of 2.dt in the width of the pulses of the output signal Vout. It can also be considered to activate only the means LC2 for decrease, or the means UC1 for increase, which will make it possible to decrease the width of the pulses by a duration dt.

Figure 4:
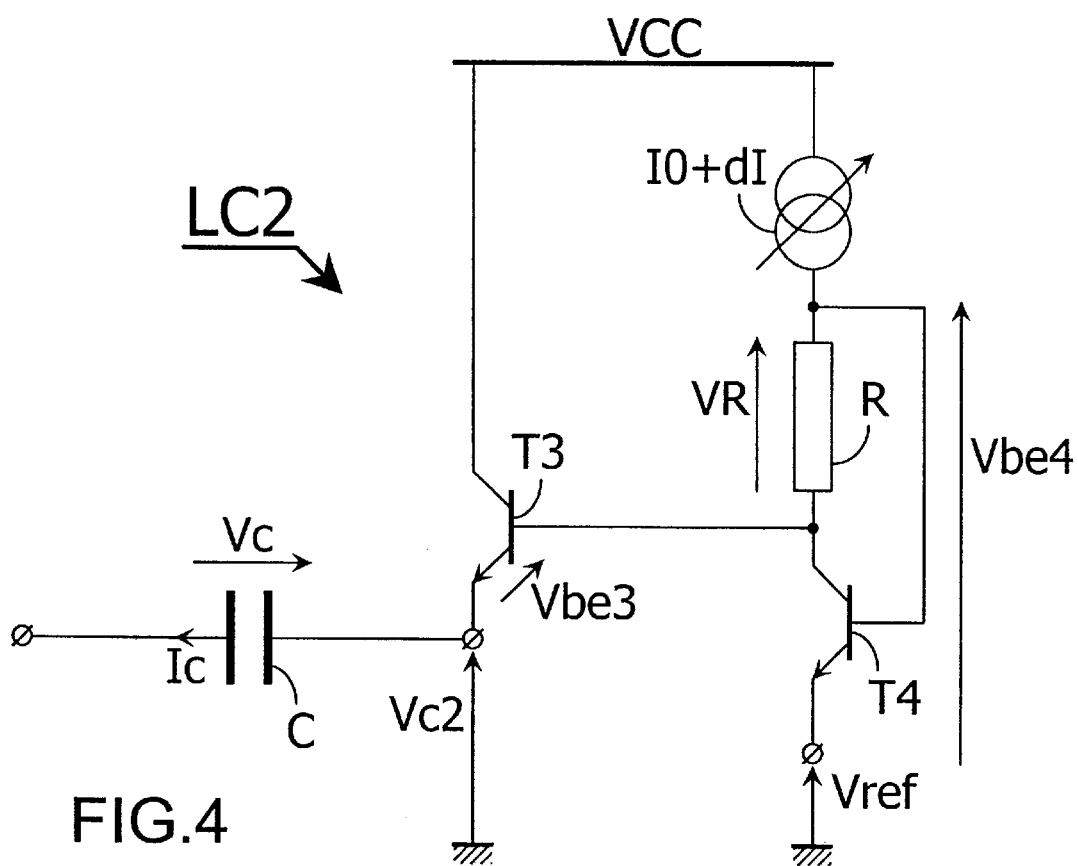
FIG. 4 is a functional diagram which describes means for decreasing potential, included in a device for modulation according to a particular embodiment of the invention.

FIG. 4 is a wiring diagram, which represents a possible embodiment for the means LC2 for decrease of the potential Vc2 of the second terminal of the capacitive element C. It will be appreciated that it is sufficient to duplicate a structure of this type in order to obtain means for decreasing the potential Vc1 of the first terminal of the capacitive element C. In the example now described, the means LC2 for decreasing the potential use bipolar transistors, but, in accordance with the description previously given, they can be replaced by transistors of the MOS type.

In this example, the means LC2 for decreasing the potential include a third and a fourth transistor T3 and T4, the emitters of which are connected to the second terminal of the capacitive element C, and to a reference terminal with a potential Vref respectively, the bases of which third and fourth transistors T3 and T4 are connected to one another via a resistive element R, which is arranged in series with the main current path of the fourth transistor T4, i.e. in this example its collector-emitter junction, the said resistive element R being connected to a current source which is designed to deliver a current IO+dI with a value which can be adjusted.

The reference potential Vref can, for example, be generated by means of a generator of the bandgap type, according to a technique which is well known to persons skilled in the art.

The functioning of the means for decreasing potential can be described as follows:

Since the base-emitter voltages Vbe3 and Vbe4 of the third and fourth transistors T3 and T4 are substantially equivalent by design, and since the resistive element R generates a voltage VR=R.(IO+dI), the potential Vc2 of the second terminal of the capacitive element C can be expressed in the form:

$$Vc2 = Vref + Vbe4 - VR - Vbe3,$$

i.e. also $$Vc2 = Vref - R.(IO+dI)$$

Thus, by varying by a quantity of current dI the current delivered by the current source, the potential Vc2 will be offset by a quantity −dV, wherein the absolute value of dV is equivalent to R.dI.

Figure 5:
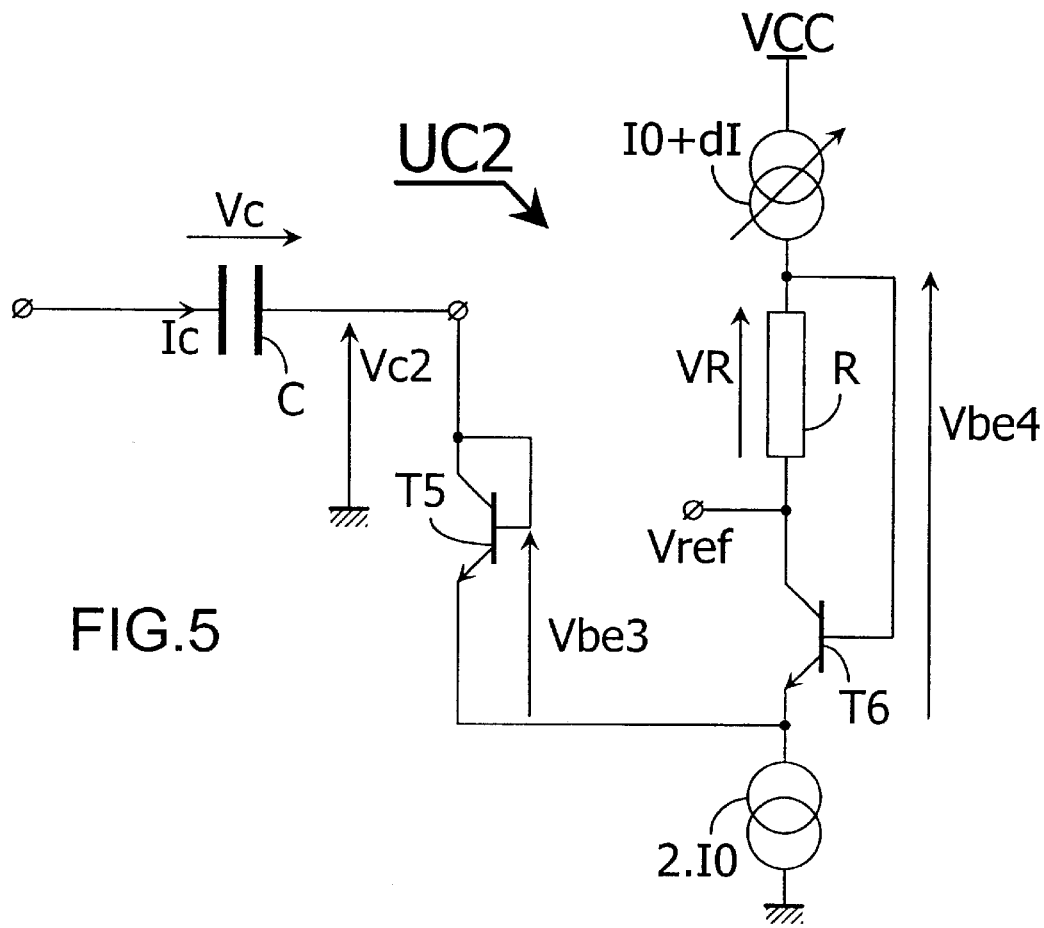
FIG. 5 is a functional diagram describing means for increasing potential included in a modulation device according to another particular embodiment of the invention.

FIG. 5 is a wiring diagram which represents a possible embodiment of the means UC2 for increasing the potential Vc2 of the second terminal of the capacitive element C. It will be appreciated that it will be sufficient to duplicate a structure of this type in order to obtain means for increasing the potential Vc1 of the first terminal of the capacitive element C. In the example now described, the means for increasing the potential use bipolar transistors, but, in accordance with the description previously provided, they can be replaced by transistors of the MOS type.

In this example, the means LC2 for increasing the potential include a fifth transistor T5, which is diode-connected between the second terminal of the capacitive element C and the emitter of a sixth transistor T6, the collector of which is connected firstly to a potential reference terminal Vref, and secondly to the base of the said sixth transistor T6, via a resistive element R, said resistive element R being connected to a current source, which is designed to deliver a current IO+dI with a value which can be adjusted.

The functioning of the means for increasing potential can be described as follows:

Since the base-emitter voltages Vbe5 and Vbe5 of the fifth and sixth transistors T5 and T6 are substantially equivalent by design, and since the resistive element R generates a voltage VR=R.(IO+dI), the potential Vc2 of the second terminal of the capacitive element C can be expressed in the form:

$$Vc2 = Vref + VR - Vbe4 + Vbe3,$$

i.e. also $$Vc2 = Vref + R.(IO+dI)$$

Thus, by varying by a quantity of current dI the current delivered by the current source, the potential Vc2 will be offset by a quantity +dV, wherein the absolute value of dV is equivalent to R.dI.

Figure 6:
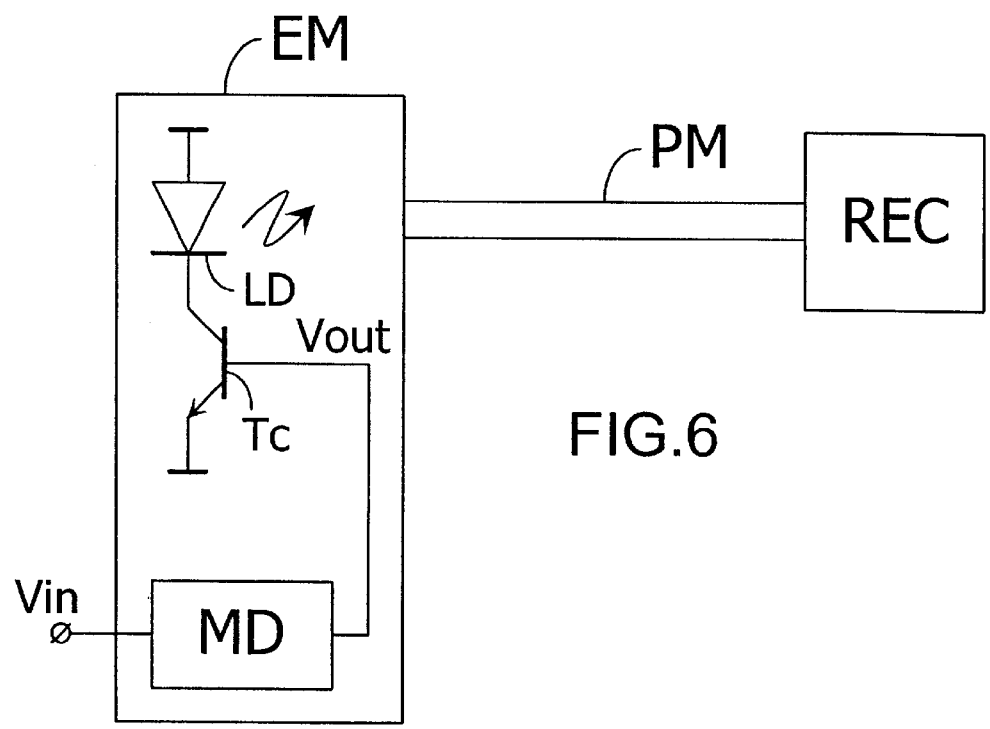
FIG. 6 is a basic circuit diagram of a telecommunications system which implements the invention.

FIG. 6 represents a telecommunications system, in which the invention is implemented. This system includes:

a light signal emitter EM;

a light signal receiver REC; and a propagation medium PM, which permits transit of the said signals from the emitter to the receiver.

The propagation medium can be, for example, an optical fiber, the receiver REC being able to comprise a photodiode, which can detect the signals emitted by the emitter EM. In the example now described, said emitter EM includes a source LD, for example a laser diode, which is designed to emit radiation when a control signal Vout of said source has an active state. In this example, the control signal Vout controls the conduction of a transistor Tc, which acts as a switch. The emitter EM additionally includes a modulation device MD according to the invention, in order to adjust the duration of the active states of the control signal Vout. The particular properties of the modulation device MD according to the invention in fact make the device particularly well suited for controlling the emission of optical data, the throughput of which is quantified in Gigabits/second.

What is claimed is:

1. A modulation device, which is designed to receive an input signal comprising a succession of pulses with a predetermined width, and to produce an output signal comprising a succession of pulses with an adjustable width, the device including:

a first and a second transistor, which are fitted as a differential pair, the conduction of which is controlled by means of the input signal of the device;

a capacitive element, which is provided with a first and a second terminal, which are connected respectively to the first and second transistor;

adjusting means for adjusting a potential of at least one of the said terminals; and comparing means, which are designed to supply the output signal of the device, an instantaneous value of which is representative of the sign of a voltage, which is taken from the terminals of the capacitive element.

2. A modulation device as claimed in claim 1, wherein the adjusting means include means for decreasing and means for increasing potential, which are associated with at least one of the terminals of the capacitive element.

3. A modulation device as claimed in claim 2, wherein the means for decreasing potential, which are associated with at least one terminal of the capacitive element, include a third and a fourth transistor the reference terminals of which are connected to said terminal of the capacitive element, and to a reference potential terminal respectively, the polarization terminals of which third and fourth transistors being connected to one another via a resistive element which is disposed in series with the main current path of the fourth transistor, and said resistive element being designed to be passed through to have a current with a value which can be adjusted.

4. A modulation device as claimed in claim 2, wherein the means for increasing potential, which are associated with at least one terminal of the capacitive element, include a fifth transistor, which is diode-connected between said terminal of the capacitive element and a reference terminal of a sixth transistor, a transfer terminal of which is connected firstly to a potential reference terminal, and to a polarization terminal of said sixth transistor, via a resistive element, said resistive element being designed to be passed through to have a current with a value which can be adjusted.

5. A light signal emitter, including a source which is designed to emit radiation when a control signal of the said source has an active state, the emitter also including a modulation device as claimed in claim 1 for adjusting the duration of the active states of the control signal.

6. A telecommunications system including:

a light signal emitter as claimed in claim 5;

a light signal receiver; and a propagation medium, which permits transit of said signals from the emitter to the receiver.

* * * * *